United States Patent [19]

Canclini

[11] Patent Number: 5,537,072
[45] Date of Patent: Jul. 16, 1996

[54] CHARGE PUMP SWITCH CIRCUITS

[75] Inventor: Athos Canclini, Santa Clara, Calif.

[73] Assignee: SGS-Thomson Microelectronics, Inc., Carrollton, Tex.

[21] Appl. No.: 268,850

[22] Filed: Jun. 30, 1994

[51] Int. Cl.[6] .................................................. H03K 17/04
[52] U.S. Cl. .......................... 327/374; 327/377; 327/437; 327/103
[58] Field of Search ..................................... 327/103, 108, 327/374, 404, 421, 437, 584, 111, 264, 377

[56] References Cited

U.S. PATENT DOCUMENTS

| | | | |
|---|---|---|---|
| 4,347,445 | 8/1982 | Baker | 327/502 |
| 4,347,447 | 8/1982 | Proebsting | 327/108 |
| 4,677,325 | 6/1987 | Einzinger et al. | 327/502 |
| 4,890,010 | 12/1989 | Neudeck et al. | 327/108 |
| 4,922,403 | 5/1990 | Feller | 363/60 |
| 5,034,875 | 7/1991 | Hattori | 363/60 |
| 5,051,881 | 9/1991 | Herold | 363/60 |
| 5,095,223 | 3/1992 | Thomas | 307/110 |
| 5,132,895 | 7/1992 | Kase | 363/60 |
| 5,180,929 | 1/1993 | Kokubun | 327/103 |

*Primary Examiner*—Timothy P. Callahan
*Assistant Examiner*—Jung Ho Kim
*Attorney, Agent, or Firm*—Joseph C. Arrambide; Lisa K. Jorgenson

[57] ABSTRACT

A switch circuit for a charge pump circuit is disclosed. The switch circuit has a first transistor for conducting current and is controlled by a second, third, and fourth transistor. The second transistor protects the first transistor for excessive gate-to-drain voltage. The third transistor receives the signal for switching the switch circuit and also serves as a cascoding transistor for protecting the fourth transistor from excessive gate-to-drain voltage. Consequently, the switch circuit can withstand high gate-to-drain voltages and has increased reliability. The switch also has a turn-off circuit to facilitate the depletion of charge on the control element of the first transistor. The switch circuit also has a zener diode to insure that excessive voltage is not applied across the gate-to drain of the first transistor.

14 Claims, 3 Drawing Sheets

5,537,072

CHARGE PUMP SWITCH CIRCUITS

BACKGROUND OF THE INVENTION

1. Field of the Invention

This invention relates to improvements in charge pump circuits, and more particularly to improvements in the switching of current in a charge pump and more particularly to improvements in using field effect transistors as rectifiers in charge pump circuits.

2. Description of the Relevant Art

In many electronics applications, it is desirable to increase the voltage of a power source to a higher voltage. Prior art FIG. 1 shows a charge pump 10 which is a typical circuit for tripling the voltage of a power source. The charge pump 10 takes the supply voltage 12 and pumps it up to a pumped voltage Vp 14, which is between two and three times the supply voltage 12.

In the charge pump circuit 10, voltage source 12 is connected to the anode of diode 16. The cathode of diode 16 is connected to the anode of diode 18 and to the first plate of capacitor 22. The cathode of diode 18 is connected to the anode of diode 20 and the first plate of capacitor 24. A clock signal 26 is applied to the inputs of inverters 28 and 30. The output of inverter 28 is connected to the second plate of capacitor 22 and the output to inverter 30 is connected to the input to inverter 32. The output to inverter 32 is connected to the second plate of capacitor 24. The cathode of diode 20 is connected to filter capacitor 34, filter resistor 36, and the output node 14 at which pumped voltage Vp is presented.

In operation, capacitor 22 is charged to the voltage source level Vs through diode 16 when the clock signal 26 is high. When clock signal 26 goes low, the output of inverter 28 is driven to the voltage source level Vs. However, the voltage across capacitor 22 remains constant, pumping the voltage at the cathode of diode 16 to two times the supply voltage Vs minus the voltage drop across diode 16. At this time, the output to inverter 32 is low (ie, at ground). If the voltage across capacitor 24 is less than the pumped voltage at capacitor 22, the charge on capacitor 22 will flow through diode 18 on to capacitor 24 charging it to the pumped voltage. On the next clock cycle, the output of inverter 32 goes high, pumping the voltage at the cathode of diode 18 to three times Vs (less diode drops), since the voltage was previously two times the voltage Vs. For this reason, this charge pump circuit 10 is commonly referred to as a voltage tripler. This tripled voltage is filtered by filter capacitor 34 and filter resistor 36 and is available as voltage Vp to a load on line 14.

However, even in the absence of a load current, it is impossible to reach the theoretical voltage of three times the supply voltage because of the voltage drop across diodes 16, 18, and 20. The voltage on capacitor 22 is the voltage of the voltage source minus the voltage drop. Similarly, the voltage on capacitor 24 becomes the voltage on capacitor 22 minus the voltage drop across diode 18. And finally, the voltage available as the pumped voltage 14 is the voltage on capacitor 24 minus the voltage drop across diode 20. As the voltage of the voltage source 12 decreases the voltage drop across diodes 16, 18, and 20 becomes even more significant since the voltage drop becomes a larger percentage of the total voltage. It is therefore desirable to replace diodes 16, 18, and 20 with active components such as MOSFET transistors which have lower voltage drops than diodes, especially when the source voltage is below five volts.

Prior art FIG. 2 shows generally the same charge pump circuit as in FIG. 1, but with diode 16, 18, and 20 replaced with switches 40, 42, and 44, respectively, and with the addition of a timing control circuit 46. The switches 40, 42, and 44 are typically p-channel MOSFET's but can be n-channel MOSFET's, bipolar transistors, or the like. The timing control circuit 46 turns on switches 40, 42, and 44 at the same time that diodes 16, 18, and 20 would have turned on, respectively. Consequently, charge pump circuit 48 operates in an analogous manner as charge pump circuit 10 of FIG. 1. However, charge pump circuit 48 is advantageous since the voltage losses across switches 40, 42, and 44 is much lower than their counterpart diodes 16, 18, and 20.

More specifically, voltage source 12 is connected to the high voltage end of switch 40. The low voltage end of switch 40 is connected to the high voltage end of switch 42 and to the first end of capacitor 22. The low voltage end of switch 42 is connected to the high voltage end of switch 44 and the first plate of capacitor 24. A clock signal 26 is connected to the inputs of inverters 28 and 30. The output of inverter 28 is connected to the second plate of capacitor 22 and the output to inverter 30 is connected to the input to inverter 32. The output to inverter 32 is connected to the second plate of capacitor 24. The low voltage end of switch 44 is connected to filter capacitor 34, filter resistor 36, and the (pumped voltage) Vp 14.

In operation, the first plate of capacitor 22 is charged to the voltage source level through switch 40 when the clock signal 26 is high. When clock signal 26 goes low, the output of inverter 28 drives the second plate of capacitor 22 to the voltage source level. Consequently, the voltage on first plate of capacitor 22 is pumped to two times the supply voltage 12 minus the voltage drop across switch 40. At this time, the output to inverter 32 is low so that the second plate of capacitor 24 is at ground. If the voltage on capacitor 24 is less than the doubled voltage on capacitor 22, the charge on capacitor 22 will flow through switch 42 on to capacitor 24 charging it to the doubled voltage. On the next clock cycle, the output of inverter 32 goes high which drives the second plate of capacitor 24 to the voltage of the voltage source. Since the voltage on capacitor 24 was two times the voltage on the voltage source 12, the voltage on the first plate of capacitor 24 is now three times the voltage of the voltage source 12 (minus the voltage drops of the switches). The pumped voltage in FIG. 2 will be higher than the pumped voltage in FIG. 1 since the voltage drop across a switch is at least 10 times less than the voltage drop across a diode.

However, it has been observed that transistors can have problems when used as switches in the high voltage environment of a charge pump circuit. More specifically, some manufacturing process technologies, such as 1.2 micron BiCMOS process, are sensitive to "hot electrons" (large voltages) such as those present in the charge pump circuit. This means, for example, that it is not possible to have gate to drain voltages higher than 6 volts in a n-channel FET. Therefore, it is desirable to develop a circuit which has the low on resistance of a transistor and yet can handle the high voltages of a charge pump circuit.

SUMMARY OF THE INVENTION

In light of the above, therefore, it is an object of the invention to provide an improved charge pump switch.

It is another object of the invention to provide a switch with a reduced voltage drop.

It is another object of the invention to provide a switch which can withstand high gate to drain voltages.

It is another object of the invention to provide a switch which is not sensitive to hot electrons.

It is yet another object of the invention to provide a switch which turns off quickly.

It is another object of the invention to provide a switch with increased reliability.

These and other objects, features, and advantages will be apparent to those skilled in the art from the following detailed description when read in conjunction with the accompanying drawings and appended claims.

In accordance with the broad aspect of the invention, a switch for selectively conducting current is presented. The switch has a first transistor for conducting current and is controlled by a second, third, and fourth transistor. The third transistor receives the signal for switching the switch circuit and also serves as a cascoding transistor for protecting the fourth transistor from excessive gate-to-drain voltage. The second transistor protects the first transistor for excessive gate-to-drain voltage. Consequently, the switch circuit can withstand high gate-to-drain voltages and has increased reliability.

In accordance with another broad aspect of the invention, a turn-off circuit is added to the switch to facilitate the depletion of charge on the control element of the first transistor.

In accordance with another broad aspect, of the invention, a zener diode is added to the switch circuit to insure that excessive voltage is not applied across the gate-to-drain of the first transistor.

DETAILED DESCRIPTION OF THE EMBODIMENT

Figure 3:
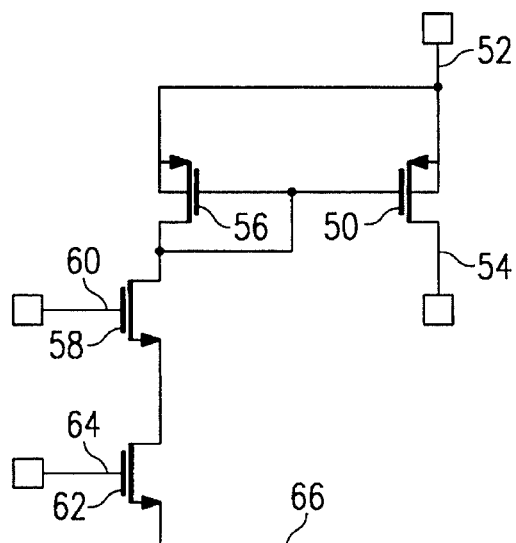
FIG. 3 is a schematic diagram of a charge pump switch.

The present invention satisfies the above objectives of providing a switch circuit with a low voltage drop which can withstand high gate to drain voltages by using the circuit in FIG. 3.

Figure 1:
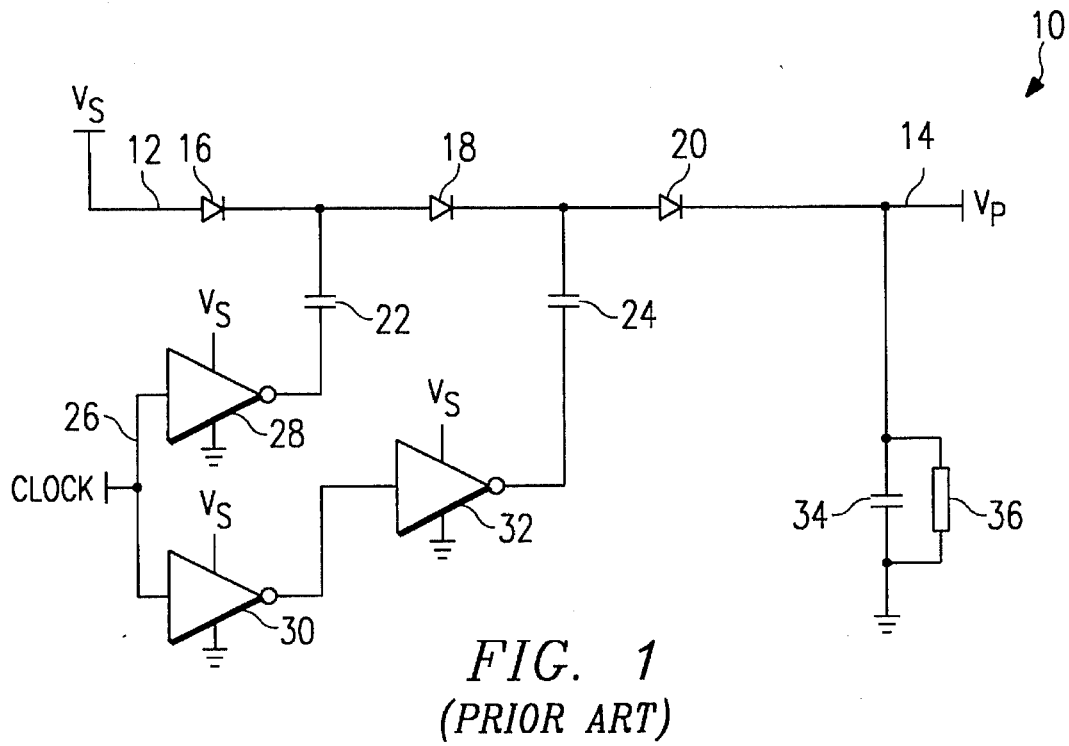
FIG. 1 is a schematic diagram of a typical prior art charge pump circuit.
Figure 2:
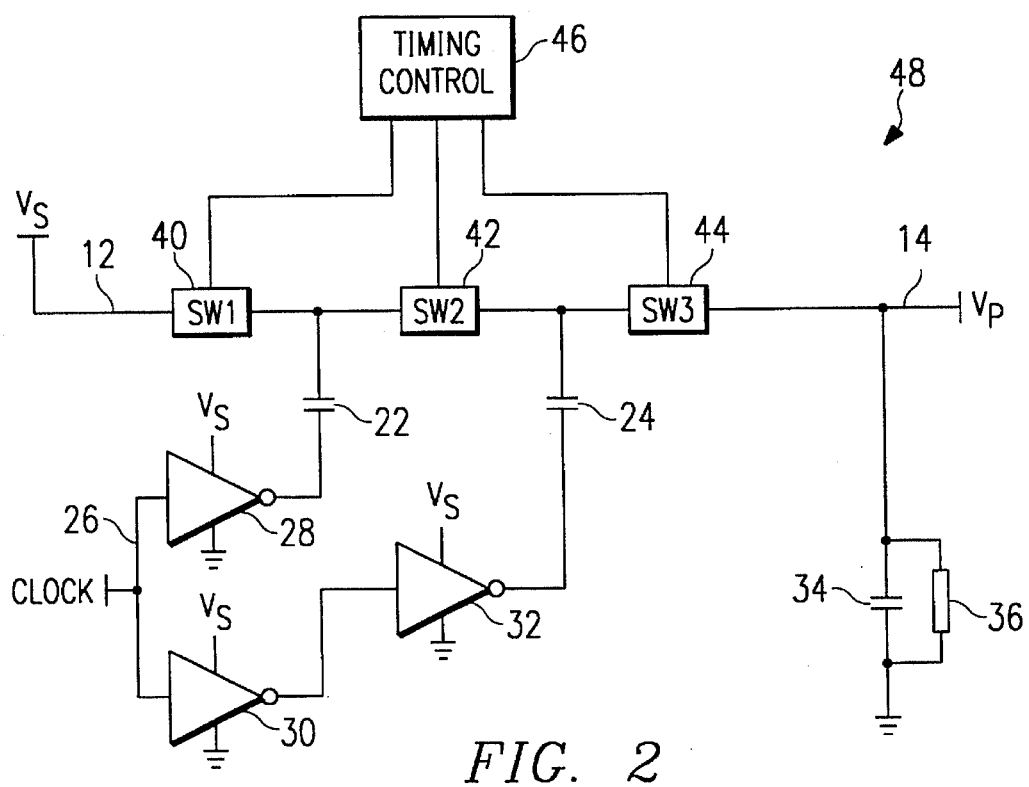
FIG. 2 is a schematic diagram of a prior art charge pump circuit using switches.

In one embodiment of the invention, FIG. 3 shows a switch circuit for a charge pump. The switch circuit corresponds to the switch 40, 42, and 44 of FIG. 2 where current flows through the switch from an input node 52 to an output node 54 through p-channel transistor 50 and where the switch is connected to the timing control circuit 46 at node 60. The circuit has a p-channel transistor 50 with a source connected to an input voltage 52, a drain connected to an output voltage 54. The gate of transistor 50 is connected to the gate and drain of p-channel transistor 56. The source of transistor 56 is connected to the source of transistor 50. The drain and gate of transistor 56 and the gate of transistor 50 are connected to the drain of n-channel transistor 58. The gate of transistor 58 is receives a timing control signal on node 60. The source of transistor 58 is connected to the drain of n-channel transistor 62. The gate of transistor 62 receives a first bias voltage 64 and the source of transistor 62 is connected to a ground.

In operation, current is conducted through transistor 50 from input voltage 52 to output voltage 54 when the timing control signal on node 60 is high. Conversely, current is blocked from conducting through transistor 50 from input voltage 52 to output voltage 54 when the timing control signal on node 60 is low. More specifically, when the timing control signal on node 60 is high, transistor 58 conducts current. First bias signal 64 keeps transistor 62 on as a constant current source. Therefore, p-channel transistor 56 is turned on which turns on transistor 50 on since their gates are connected, thus allowing current to flow from input voltage 52 to output voltage 54. Transistor 58 acts as the switching transistors for the switch circuit and as a cascoding transistor which prevents the voltage on the drain of transistor 62 from reaching a high voltage.

Conversely, transistor 58 is turned off when the timing control signal on node 60 is low. This consequently turns off transistor 56. With transistor 56 off, the gate of transistor 50 is pulled high to the voltage on gate 56 turning off transistor 50. Again, transistor 58 acts as the switching transistor for the switch circuit and as a cascoding transistor which prevents the voltage on the drain of transistor 62 from reaching a high voltage. This embodiment offers the advantages of providing a reduced voltage drop switch which can withstand high gate to drain voltages and which is not sensitive to hot electrons since transistor 56 limits the drain to gate voltage of transistor 50 and since transistor 58 limits the drain to gate voltage of transistor 62.

Figure 4:
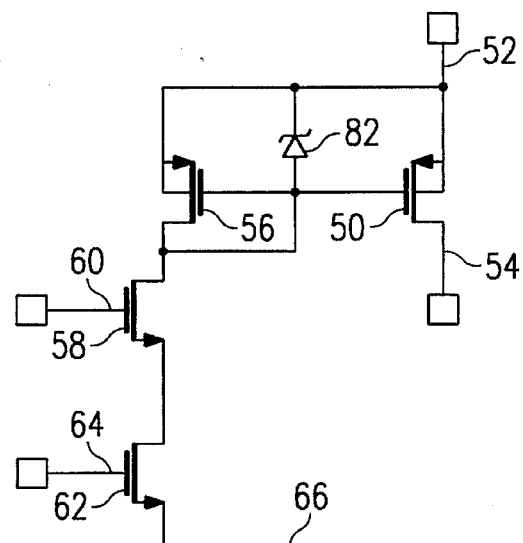
FIG. 4 is a schematic diagram of a charge pump switch with a zener diode.

FIG. 4 shows another embodiment of the invention which includes a zener diode 82 connected between the sources of transistors 50 and 56 and the gates of transistors 50 and 56. The circuit in FIG. 4 operates in the same manner as the circuit in FIG. 3 but offers the additional gate-to-source breakdown voltage protection of zener diode 82. More specifically, since the drain and source of transistor 50 may reach high voltages, such as more than 15 volts, it is may be desirable to clamp the gate-to-source voltage to the breakdown voltage of the zener diode 82, such as at 5.6 volts. The zener diode 56 insures that the transistors 50 and 56 are never exposed to excessive voltage, thus increasing the reliability of the circuit.

Figure 5:
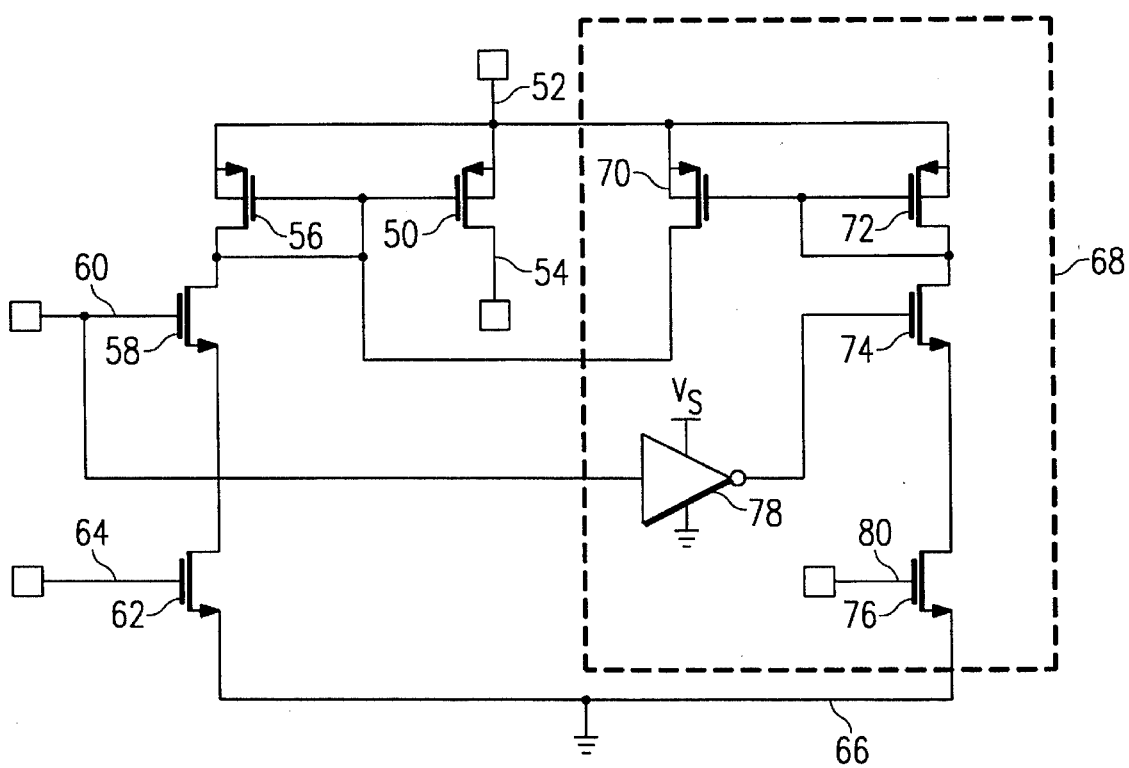
FIG. 5 is a schematic diagram of a charge pump switch with a turn-off circuit.

In another embodiment of the invention, shown in FIG. 5, the turn-off of transistor 50 is facilitated by a clamping circuit 68 connected between the gate of transistor 50 and a reference voltage, and having a control element connected to the timing control signal on node 60 and gate of transistor 58. This embodiment operates like the circuit in FIG. 3 but has the added benefit of turning off transistor 50 quicker by discharging the gate-source capacitance of transistor 50 when the timing control signal is low.

More specifically, the turn-off circuit 68 consists transistors 70, 72, 74, and 76 and of an inverter 78. The source of p-channel transistor 70 is connected to the source of transistor 50 and the drain of transistor 70 is connected to the gate of transistors 50 and 56. The gate of transistor 70 is connected to the gate and drain of p-channel transistor 72 and the drain of n-channel transistor 74. The source of transistor 72 is connected to the source of transistor 50. The input of inverter 78 is connected to the timing control signal on node 60 and to the gate to transistor 58. The output of inverter 78 is connected to the gate of n-channel transistor 74. The source of transistor 74 is connected to the drain of n-channel transistor 76. The gate of transistor 76 is connected to a second bias voltage on node 80 and the source is connected to a reference voltage 66.

In operation, current is conducted through transistor 50 from input voltage 52 to output voltage 54 when the timing control signal on node 60 is high. Conversely, current is blocked from conducting through transistor 50 from input voltage 52 to output voltage 54 when the timing control signal on node 60 is low. More specifically, when the timing control signal on node 60 is high, transistor 58 turns on. First bias signal 64 keeps transistor 62 on as a constant current source. Therefore, transistor 56 is turned on which forces transistor 50 on, thus allowing current to flow from input voltage 52 to output voltage 54. At this time, the output of inverter 78 is low and thus transistor 74 is off. This state keeps transistors 70 and 72 off. Transistor 58 acts as the switching transistor for the circuit and as a cascoding transistor which prevents the voltage on the drain of transistor 62 from reaching a high voltage.

Conversely, transistor 58 is turned off when the timing control signal on node 60 is low. This consequently turns off transistor 56. Additionally, the output to inverter 78 is high, transistor 74 is on, and transistors 70, 72, and 74 are conducting. With transistor 70 on, the gate-to-source capacitance of transistor 50 is quickly discharged which facilitates its turn-off. Additionally, transistor 74 acts as a complementary switching transistor for the circuit and as a cascoding transistor which prevents the voltage on the drain of transistor 76 from reaching a high voltage. This embodiment offers the advantages of providing a reduced voltage drop switch circuit which can withstand high gate to drain voltages and which is not sensitive to hot electrons since transistor 56 limits the drain to gate voltage of transistor 50 and since transistor 58 limits the drain-to-gate voltage of transistor 62. Additionally, this embodiment provides a turn-off circuit which facilitates the quick turn-off of transistor 50.

Figure 6:
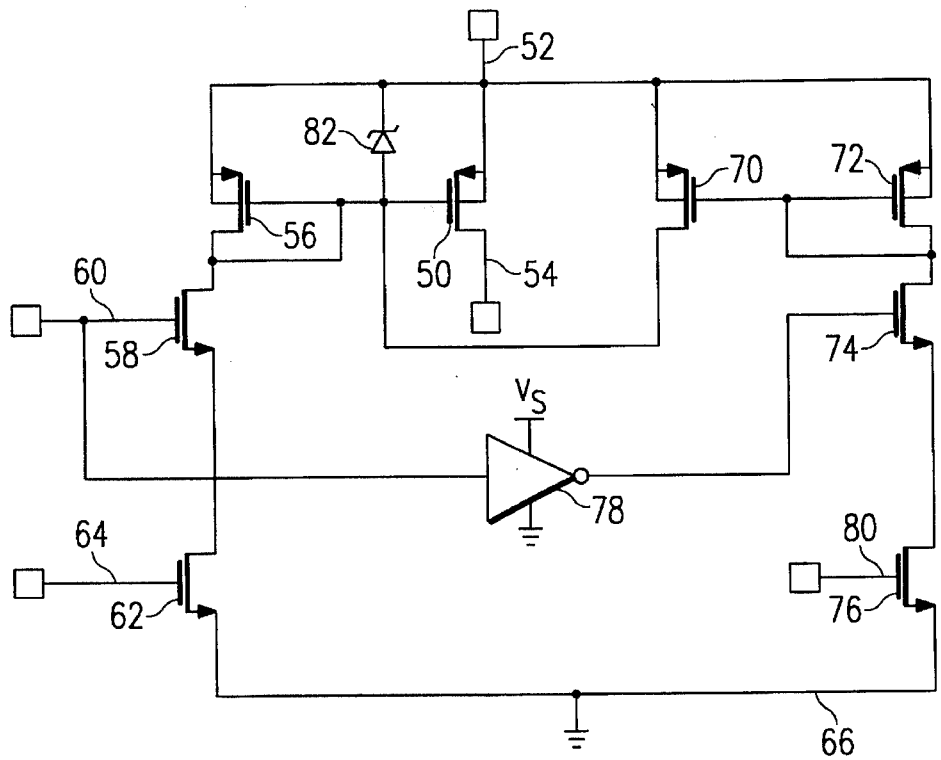
FIG. 6 is a schematic diagram of a charge pump switch with a zener diode and a turn-off circuit in accordance with the preferred embodiment.

FIG. 6 shows another embodiment of the present invention, similar to the switch circuit in FIG. 5, but including zener diode 82 connected between the sources and the gate of transistors 50 and 56. In operation, the circuit in FIG. 6 operates in the same manner as the circuit in FIG. 5 but offers the additional gate-to-source breakdown voltage protection of zener diode 82. More specifically, since the drain and source of transistor 50 may reach high voltages, such as more than 15 volts, it is desirable to clamp the gate-to-source voltage to the breakdown voltage of the zener diode 82, such as at 5.6 volts. The zener diode 56 insures that the transistors 50 and 56 are never exposed to excessive voltage which increases the reliability of the circuit.

Figure 7:
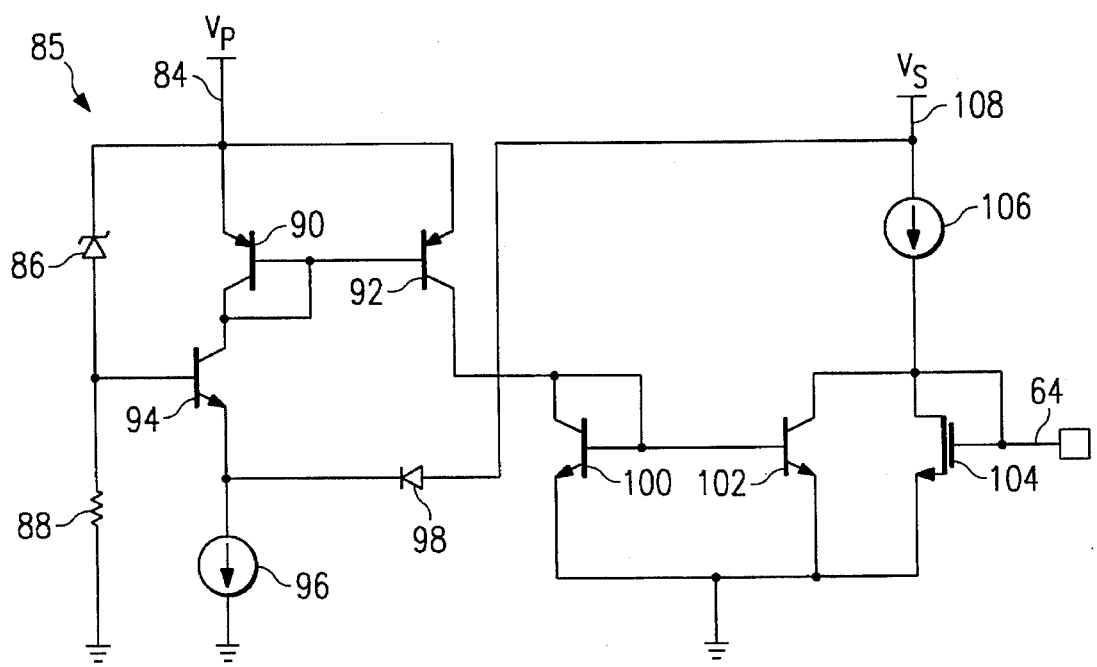
FIG. 7 is a schematic diagram of a bias current circuit for biasing a charge pump switch in accordance with the preferred embodiment.

The switch circuits described in FIG. 3, 4, 5, and 6 show a bias current on node 64 connected to the gate of transistor 62. The bias current on node 64 is typically designed to provide the bias necessary for transistor 62 to act as a 10 microamp current source. FIG. 7 shows the preferred embodiment of the bias current circuit 85 for generating the bias current on node 64 which provides the bias necessary for transistor 62 to act as a 10 microamp current source and also provides negative feedback to the switch circuit to decrease the conductivity of the switch circuit when the pumped voltage exceeds a safe level.

The pumped voltage (Vp) 84 is connected to the bias current circuit 85 through the cathode of zener diode 86, the emitter of transistor 90, and the emitter of transistor 92. The anode of zener diode 86 is connected to resistor 88 and to the base of transistor 94. The other end of resistor 88 is connected to ground. The base of transistor 90 is connected to its collector, the collector of transistor 94 and to the base of transistor 92. The emitter of transistor 94 is connected to a current source and to the cathode of diode 98. The other end of current source 96 is connected to a reference voltage. The collector of transistor 92 is connected to the collector and base of transistor 100 and the base of transistor 102. The emitters of transistors 100 and 102 and the source of transistor 104 are connected to ground. The collector of transistor 102 is connected to the gate and drain of transistor 104 and to the source of current source 106. The anode of diode 98 and the drain of current source 106 are connected to the voltage source 108 (Vs).

In operation, the bias current circuit 85 regulates the pumped voltage 84 (VP) by providing a negative feedback current to the gate of transistor 58 of FIGS. 3, 4, 5, and 6. More specifically, the base of transistor 94 is pulled to ground by anti-leakage resistor 88 when:

$$Vp-Vs<Vz+Vbe$$

Where:

Vp=pumped voltage

Vs=supply voltage

Vz=zener diode voltage

Vbe=base to emitter turn-on voltage

When the base is not pulled to ground, current flows in transistor 94, driven by the zener in the conducting state. The current flow of transistor 94 is mirrored by the current mirror set up by transistors 90, 92, 100, and 102. The mirrored current of transistor 102 is subtracted from the fixed current feeding the first bias current on node 64. As the first bias current is decreased, the voltage drop across the switch circuit is increased which decreases the output of the charge pump circuit, thereby completing the negative feedback loop.

It should be noted that the circuit of the invention can be integrated on a single integrated circuit. Thus, the present invention provides significant cost and reliability advantages over prior approaches.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed. The transistors in the drawings can be any transistor commonly used such as bipolar junction transistors or field effect transistors.

We claim:

1. A circuit for switching a current on and off comprising:

a first transistor having a control element and having a current path with an input voltage side and an output voltage side;

a second transistor having a control element and having a current path with a first end and a second end, the first end of said second transistor being connected to the input voltage side of said first transistor, the control element and the second end of said second transistor being connected to the control element of said first transistor;

a third transistor having a control element for receiving a timing control signal, and having a current path with a first end and a second end, the first end of said third transistor being connected to the second end of said second transistor;

a fourth transistor having a control element for receiving a first bias voltage and having a current path with a first end and a second end, the first end of said fourth transistor being connected to the second end of said third transistor and the second end of said fourth transistor being connected to a voltage reference;

a fifth transistor having a current path having a first end and a second end, the first end of said fifth transistor being connected to the input side of the current path of said first transistor and the second end of said fifth transistor being connected to the control element of said first transistor;

a sixth transistor having a control element connected to the control element of said fifth transistor and having a current path with a first end and a second end, the first end of said sixth transistor being connected to said first end of said fifth transistor;

a seventh transistor having a control element and having a current path with a first end and a second end, the first end of said seventh transistor being connected to the second end of said sixth transistor and the control element of said sixth transistor;

an inverter having an input connected to the control element of said third transistor and having an output connected to the control element of said seventh transistor; and an eighth transistor having a control element for receiving a second bias voltage and having a current path with a first end connected to the second end of said seventh transistor and a second end connected to the voltage reference.

2. The circuit of claim 1 wherein said first transistor comprises a p-channel field effect transistor.

3. The circuit of claim 1 wherein said second transistor comprises a p-channel field effect transistor.

4. The circuit of claim 1 wherein said third transistor and fourth transistor comprise n-channel field effect transistors.

5. The circuit of the claim 1 further comprising a zener diode having an anode connected to the control element of said first transistor and having a cathode connected to the output voltage side of said first transistor, for protecting said first transistor from excessive voltage.

6. The circuit of claim 1 wherein said fifth transistor comprises a p-channel field effect transistor and said sixth transistor comprises a p-channel field effect transistor.

7. A circuit for switching a current on and off comprising:

a first transistor having a source, having a drain, and having a control element, wherein the source and the drain form a conduction path of said circuit;

a second transistor having a source connected to the source of said first transistor, having a drain, and having a gate connected to the gate of said first transistor and to the drain of said second transistor;

a third transistor having a drain connected to the drain of said second transistor, having a source, and having a gate for receiving a timing control signal;

a fourth transistor having a drain connected to the source of said third transistor, having a source connected to a voltage reference, and having a gate for receiving a first bias voltage;

a zener diode having an anode connected to the gate of said first transistor and having a cathode connected to the source of said first transistor;

a fifth transistor having a source connected to the source of said first transistor, having a drain connected to the gate of said first transistor, and having a gate;

a sixth transistor having source connected to the source of said fifth transistor, having a drain connected its gate;

a seventh transistor having a drain connected to the drain of said sixth transistor, having a gate, and having a source;

an inverter having an input connected to the gate of said third transistor, and having an inverted output connected to the gate of said seventh transistor; and an eighth transistor having a gate for receiving a second bias voltage, having a drain connected to the source of said seventh transistor, and having a source connected to the voltage reference.

8. The circuit of claim 7 wherein said first transistor comprises a p-channel field effect transistor.

9. The circuit of claim 7 wherein said second transistor comprises a p-channel field effect transistor.

10. The circuit of claim 7 wherein said fifth transistor comprises a p-channel field effect transistor and said sixth transistor comprises a p-channel field effect transistor.

11. A charge pump circuit having a plurality of inverters, a plurality of capacitors, and a plurality of switches, wherein each of the plurality of switches comprise:

a first transistor having a source connected to an input node, having a drain connected to an output node, and having a control element, for selectively conducting current from said input node to said output node;

a second transistor having a source connected to the source of said first transistor, having a drain, and having a gate connected to the gate of said first transistor and to the drain of said second transistor, for facilitating a turn-off of said first transistor;

a third transistor having a drain connected to the drain of said second transistor, having a source, and having a gate for receiving a timing control signal;

a fourth transistor having a drain connected to the source of said third transistor, having a source connected to a reference voltage, and having a gate for receiving a first bias voltage, so that said switching circuit withstands a high voltage from the source of said first transistor to the gate of said third transistor; and a zener diode having an anode connected to the gate of said first transistor and having a cathode connected to the source of said first transistor;

a fifth transistor having a source connected to the source of said first transistor, having a drain connected to the gate of said first transistor, and having a gate;

a sixth transistor having source connected to the source of said fifth transistor, having a drain, and having a gate connected its drain and to the gate of said fifth transistor;

a seventh transistor having a drain connected to the drain of said sixth transistor, having a gate, and having a source;

an inverter having an input connected to the gate of said third transistor, and having an inverted output connected to the gate of said seventh transistor; and an eighth transistor having a gate for receiving a second bias voltage, having a drain connected to the source of said seventh transistor, and having a source connected to a voltage reference.

12. The circuit of claim 11 wherein said first transistor comprises a p-channel field effect transistor.

13. The circuit of claim 11 wherein said second transistor comprises a p-channel field effect transistor.

14. The circuit of claim 11 wherein said fifth transistor comprises a p-channel field effect transistor and said sixth transistor comprises a p-channel field effect transistor.

* * * * *